(12) United States Patent
Takahashi

(10) Patent No.: US 8,787,019 B2
(45) Date of Patent: Jul. 22, 2014

(54) ELECTRIC POWER CONVERTER FOR ROLLING STOCK

(75) Inventor: Kiyoshi Takahashi, Sagamihara (JP)

(73) Assignee: Fuji Electric Co., Ltd. (JP)

( * ) Notice: Subject to any disclaimer, the term of this patent is extended or adjusted under 35 U.S.C. 154(b) by 193 days.

(21) Appl. No.: 13/542,789

(22) Filed: Jul. 6, 2012

(65) Prior Publication Data

US 2013/0016481 A1 Jan. 17, 2013

(30) Foreign Application Priority Data

Jul. 13, 2011 (JP) ................................. 2011-154525

(51) Int. Cl.
*H05K 7/20* (2006.01)
*H05K 7/14* (2006.01)
*H05K 5/00* (2006.01)
*H05K 5/02* (2006.01)

(52) U.S. Cl.
CPC .......... *H05K 7/20418* (2013.01); *H05K 7/2039* (2013.01); *H05K 7/2089* (2013.01); *H05K 7/209* (2013.01); *H05K 7/1407* (2013.01); *H05K 7/1408* (2013.01); *H05K 7/1432* (2013.01); *H05K 7/20127* (2013.01); *H05K 5/00* (2013.01); *H05K 5/0204* (2013.01)
USPC ........... 361/690; 361/726; 361/727; 361/732; 361/747

(58) Field of Classification Search
CPC . H05K 7/20; H05K 7/20409; H05K 7/20418; H05K 7/2089; H05K 7/209; H05K 7/1408; H05K 7/1407; H05K 7/1432; H05K 7/20127; H05K 7/20245; H05K 5/00; H05K 5/0204
USPC .............................. 361/724, 748, 818; 307/31
See application file for complete search history.

(56) References Cited

U.S. PATENT DOCUMENTS

| | | | | |
|---|---|---|---|---|
| 4,599,680 A | * | 7/1986 | Gibson et al. | 361/679.31 |
| 4,716,498 A | * | 12/1987 | Ellis | 361/715 |
| 4,771,365 A | * | 9/1988 | Cichocki et al. | 361/705 |
| 6,657,861 B2 | * | 12/2003 | Irmer | 361/695 |
| 6,938,678 B1 | * | 9/2005 | Bortolini et al. | 165/80.4 |
| 7,460,367 B2 | * | 12/2008 | Tracewell et al. | 361/679.48 |
| 7,911,792 B2 | * | 3/2011 | Liang et al. | 361/699 |
| 8,369,090 B2 | * | 2/2013 | Chester et al. | 361/699 |
| 8,427,828 B2 | * | 4/2013 | Kehret et al. | 361/679.54 |
| 2007/0165376 A1 | * | 7/2007 | Bones et al. | 361/688 |

FOREIGN PATENT DOCUMENTS

| | | |
|---|---|---|
| JP | 2004140894 A | 5/2004 |
| JP | 2005223277 A | 8/2005 |

* cited by examiner

*Primary Examiner* — Gregory Thompson
(74) *Attorney, Agent, or Firm* — Rossi, Kimms & McDowell LLP

(57) ABSTRACT

An electric power converter can include an electric power converter case mounted on rolling stock, a unit mounting section formed in the electric power converter case and having a cooler insertion opening, and an internal unit mounted on the unit mounting section. The internal unit can include a cooler projecting from the unit mounting section through the cooler insertion opening into an outside air introduction section into which the outside air is introduced and a plurality of securing holders made to butt against the unit mounting section for securing the internal unit. Each of the securing holders can have a butting surface for butting against the unit mounting section to form a step by making the butting surface protrude from the opposed surface of the internal unit facing the unit mounting section.

11 Claims, 15 Drawing Sheets

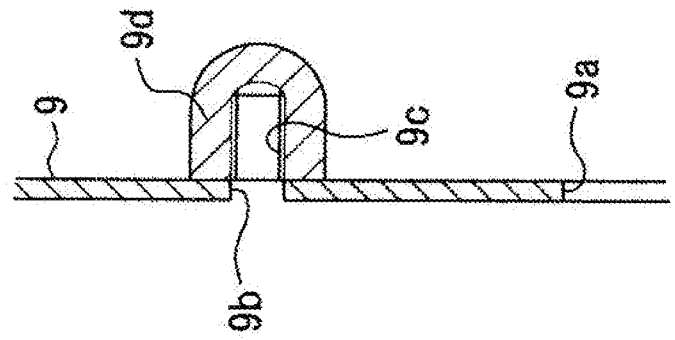
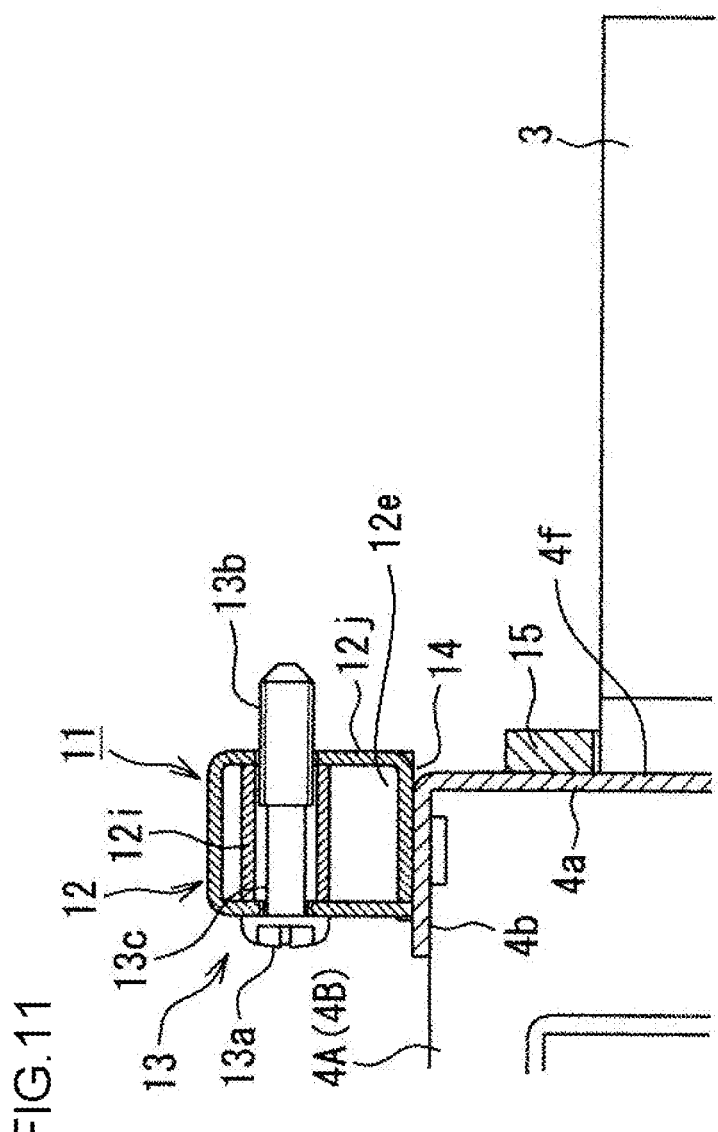
FIG.11

ELECTRIC POWER CONVERTER FOR ROLLING STOCK

BACKGROUND OF INVENTION

1. Field of the Invention

Embodiments of the present invention relate to an electric power converter for rolling stock, mounted on rolling stock.

2. Background Art

An electric power converter for rolling stock of this kind is known, which has the following structure (see, for example, Japanese Patent Document No. JP-A-2005-223277). In the structure, a case containing electric components, such as semiconductor devices, is arranged beneath the floor of rolling stock and, onto the top plate of the case, a heat pipe of a zigzag thin pipe is connected which has a plurality of projections and in which a cooling medium is enclosed. At the end of the heat pipe of the zigzag thin pipe, a heat radiating fin is connected.

Such a structure is provided so that the inside of an electric power converter for rolling stock is cooled by the heat radiating fin through the heat pipe of zigzag thin pipe and the cooling medium.

Moreover, as an electric power converter for rolling stock having another structure of a cooling system formed, an electric power converter is known which has the following structure (see, for example, Japanese Patent Document JP-A-2004-140894).

In the structure, semiconductor devices converting electric power are contained in a case, in a part of which a cooling wind tunnel is provided through which a cooling wind flows. Onto a partition dividing the cooling wind tunnel, a plurality of semiconductor device cooling units whose heat radiating sections face the cooling wind tunnel are mounted with gaskets put in between. This provides the cooling wind tunnel and an electrical component mounting section so that they are divided and watertight.

However, in the example of a related electric power converter for rolling stock described in JP-A-2005-223277, onto the top plate of the case containing electric components such as semiconductor devices, the heat pipe of the zigzag thin pipe is directly connected to cool the electric components. Thus, there is no need to secure watertightness. But there is still an unsolved problem in that the heat pipe of zigzag thin pipe is expensive to increase the manufacturing cost of an electric power converter for rolling stock.

Compared with this, in the invention described in JP-A-2004-140894, on the partition dividing the cooling wind tunnel, the heat radiating sections formed with cooling fins of the semiconductor device cooling units are provided so as to be arranged to face the cooling wind tunnel. Thus, the manufacturing cost can be reduced. However, for providing a drip-proof structure with the cooling wind tunnel and the electrical component mounting section divided in watertight, it is necessary to provide gaskets.

In this case, the gaskets are positioned between the opening of the case and peripheral sections of the cooling units. Hence, by adjusting tightening force of a screw, the gasket is compressed to a proper thickness so as to secure a drip-proof state.

In this way, in the example of a related electric power converter described in JP-A-2004-140894, for securing a drip-proof state, the gasket must be compressed down to a proper thickness. Thus, the compression of the gasket down to the proper thickness is carried out in such a way as to adjust a tightening force applied to a tightening piece such as a screw. The adjustment of the tightening force is often managed by making an adjustment of the torque applied by a tightening tool. In this process, however, there is an unsolved problem that the compressed thickness of the gasket is not stably determined. Moreover, there is also an unsolved problem in that a tightening torque applied to a screw sometimes becomes larger compared to the strength of a section where the gasket is secured by the screw to result in deformation of the section.

Accordingly, there are unsolved problems in the art of electric power converters for rolling stock, and with providing electric power converters for rolling stock which can allow proper compression of the gaskets to be correctly carried out, to provide a drip-proof state with the use of gaskets.

SUMMARY OF THE INVENTION

Embodiments of the invention address these and other needs. A first aspect of an electric power converter for rolling stock according to embodiments of the invention includes an electric power converter case mounted on rolling stock, a unit mounting section formed in the electric power converter case, the unit mounting section having an insertion opening, and an internal unit mounted on the unit mounting section. Moreover, the internal unit includes a cooler projecting from the unit mounting section through the insertion opening, and a plurality of securing holders being made to butt against the unit mounting section for securing the internal unit. Furthermore, each of the securing holders has a butting surface for butting against the unit mounting section and forms a step by making the butting surface protrude from the surface of the internal unit facing the unit mounting section, and a sealing gasket having a thickness larger than the protrusion length of the step is arranged between the unit mounting section and the surface of the internal unit facing the unit mounting section.

In a second aspect of the electric power converter for rolling stock according to the invention, each of the securing holders has a mounting screw rotatably held therein, and the unit mounting section has insertion openings each for inserting the mounting screw and has cap nuts each closing the insertion opening on the side opposite to the securing holder and being made to be in thread engagement with the mounting screw.

In a third aspect of the electric power converter for rolling stock according to a third aspect of the invention, the securing holder at least includes a square tube and a hollow spacer. The square tube is arranged so that the direction of the axis thereof is in parallel with the unit mounting section, and includes a side plate section having an internal thread portion and arranged on the opposite side of the unit mounting section, and a side plate section having a through hole and arranged on the side of the unit mounting section so as to make the through hole face the internal thread portion. The hollow spacer is arranged in the square tube so as to make the internal thread portion and the through hole communicate with each other. The mounting screw is attached to the square tube as a necked screw, formed with a head, an external thread portion provided on the front side and a neck formed between the head and the external thread portion with a diameter smaller than that of the external thread portion, so that the external thread portion is made to pass through the internal thread portion while being brought into thread engagement with the internal thread portion before the neck is inserted into the internal thread portion, and then the external thread portion protrudes onto the unit mounting section side through the through hole.

In a fourth aspect of the electric power converter for rolling stock according to the invention, the square tube is formed with a plate bent to form the side plate section having the internal thread portion, the side plate section having the through hole in parallel with the side plate section having the internal thread portion, a top plate section connecting the top end of the side plate section having the internal thread portion and the top end of the side plate section having the through hole, and a bottom plate section connecting the bottom end of the side plate section having the internal thread portion and the bottom end of the side plate section having the through hole, and with the beginning and the terminal of the bent plate connected together after the hollow spacer is secured inside the bent plate.

Moreover, in a fifth aspect of the electric power converter for rolling stock according to the invention, the securing holders are arranged around the cooler and, between the cooler and the securing holders, the sealing gasket is arranged so as to surround the cooler.

In a sixth aspect of the electric power converter for rolling stock according to a third aspect of the invention, each of the securing holders is attached to the internal unit with the protrusion length of the step made adjustable to the compressed thickness of the sealing gasket.

In a seventh aspect of the electric power converter for rolling stock according to the invention, the surface of the internal unit opposite to the unit mounting section is formed in square on each side of which at least one of the securing holders is attached.

In an eighth aspect of the electric power converter for rolling stock according to the invention, the electric power converter case has therein an outside air introduction section having the outside air introduced thereto and an internal unit containing section containing the internal unit and shielded from the outside air introduction section by the unit mounting section, and is provided with a top plate having an opening that makes the outside air introduction section communicate with the outside.

According to embodiments of the invention, in mounting the internal units on the unit mounting section formed in the electric power converter case, a plurality of the securing holders butting against the unit mounting section for securing the internal units are provided on the internal units. With the butting surface of each of the securing holders against the unit mounting section made to protrude from the opposed surface of each of the internal units facing the unit mounting section so as to form a step, the sealing gasket having the thickness larger than the protrusion length of the step is arranged between the unit mounting section and the opposed surface of each of the internal units facing the unit mounting section.

BRIEF DESCRIPTION OF THE DRAWINGS

FIG. 11 is an enlarged side view showing a state before the internal unit is attached to the unit mounting section;

DETAILED DESCRIPTION

In the following, embodiments of the invention will be explained with reference to the attached drawings.

Figure 1:
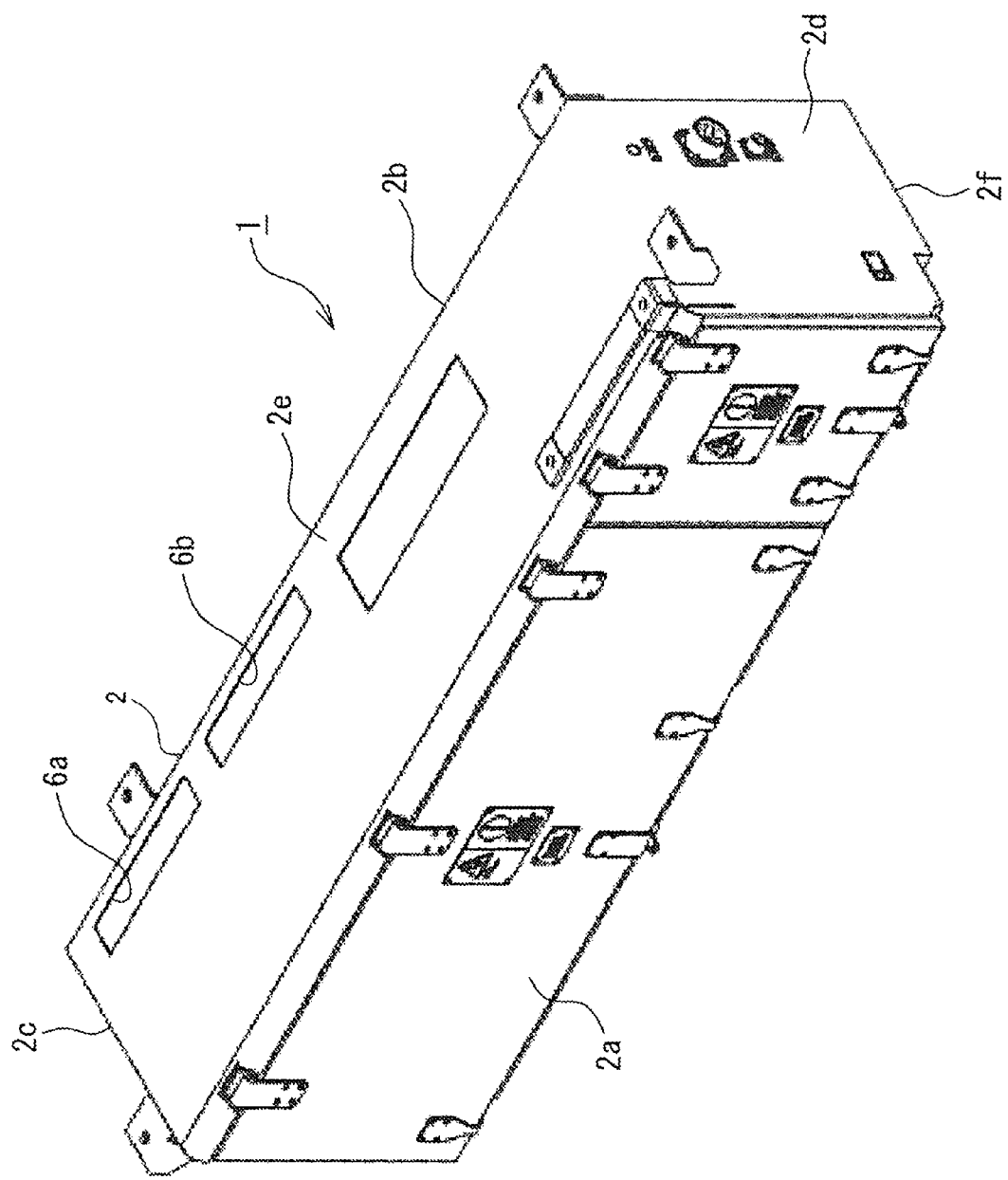
FIG. 1 is an external perspective view showing an electric power converter for rolling stock according to embodiments of the invention.
Figure 2:
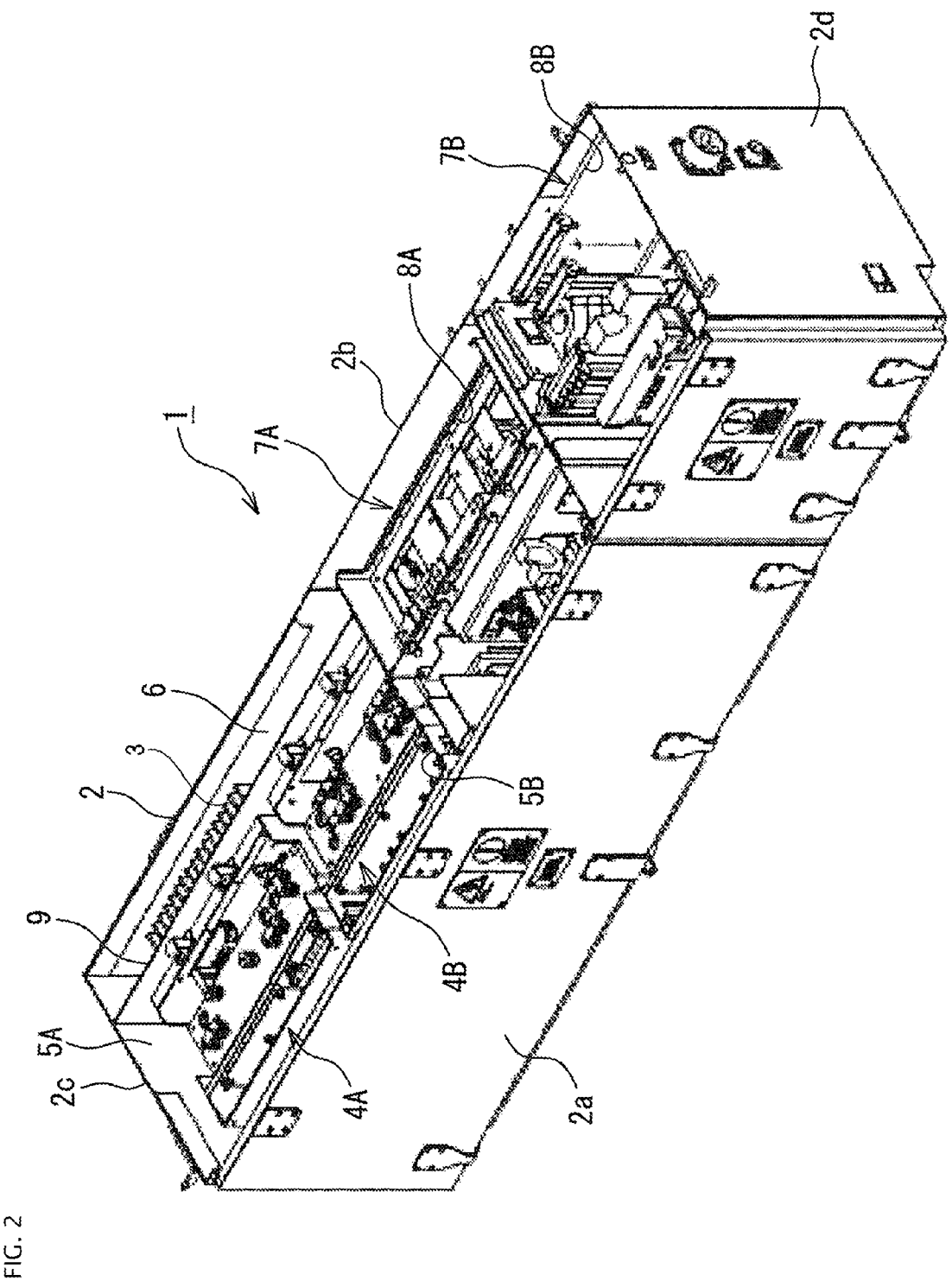
FIG. 2 is a perspective view showing the electric power converter for rolling stock shown in FIG. 1 with a top plate thereof being removed.
Figure 3:
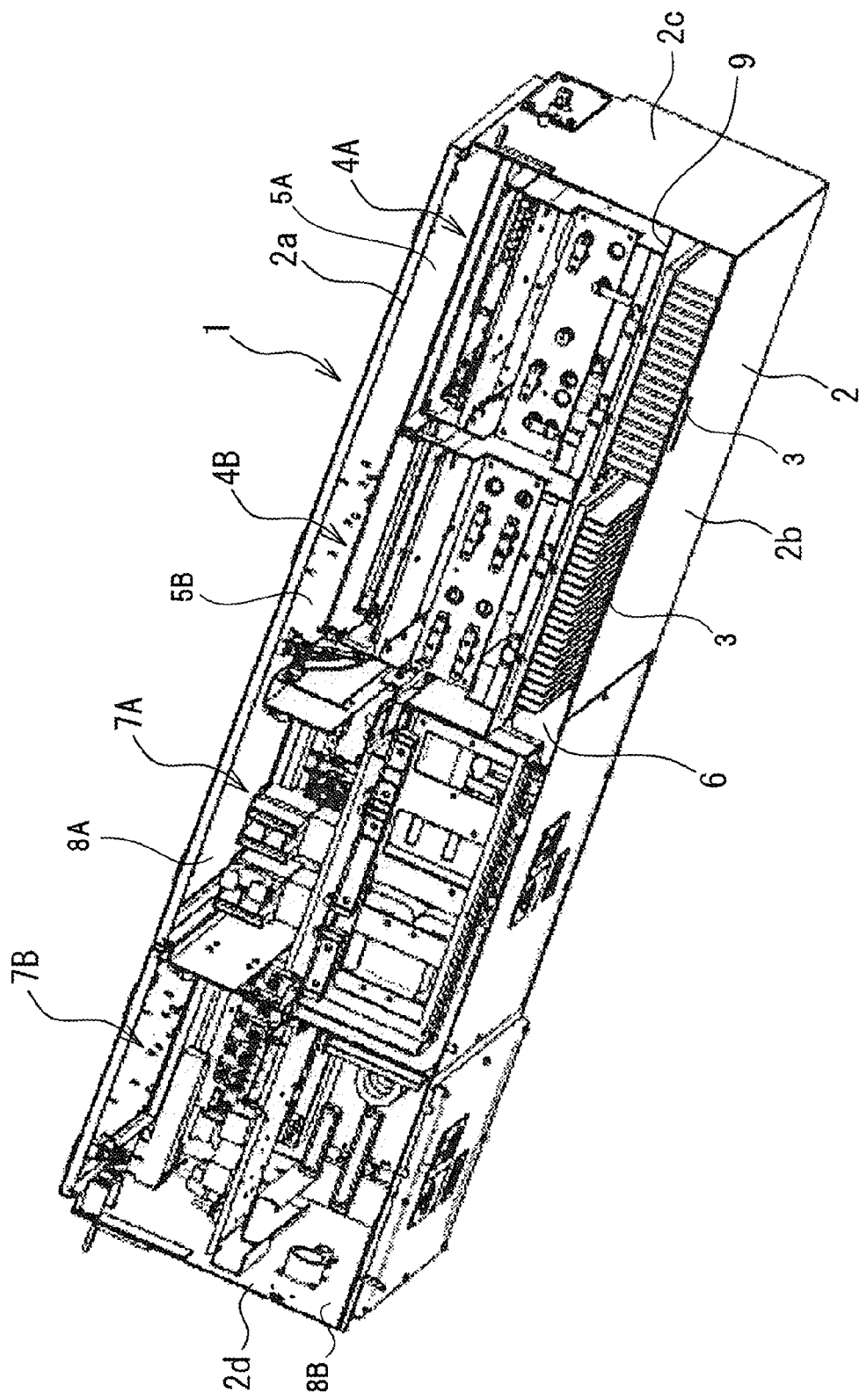
FIG. 3 is a perspective view showing the electric power converter for rolling stock shown in FIG. 2 viewed from the upper left on the opposite side in FIG. 2.
Figure 4:
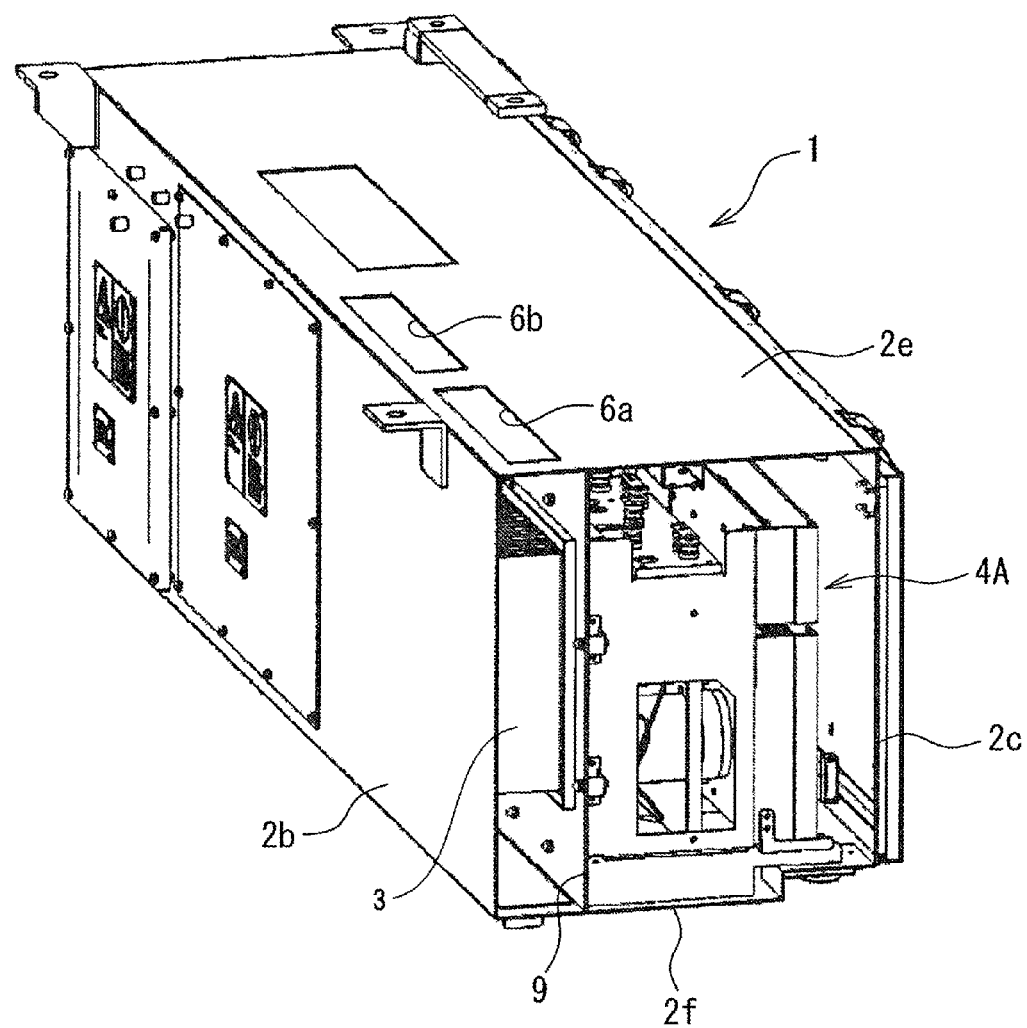
FIG. 4 is a perspective view showing the electric power converter for rolling stock shown in FIG. 1 with a left side plate thereof being removed.
Figure 5:
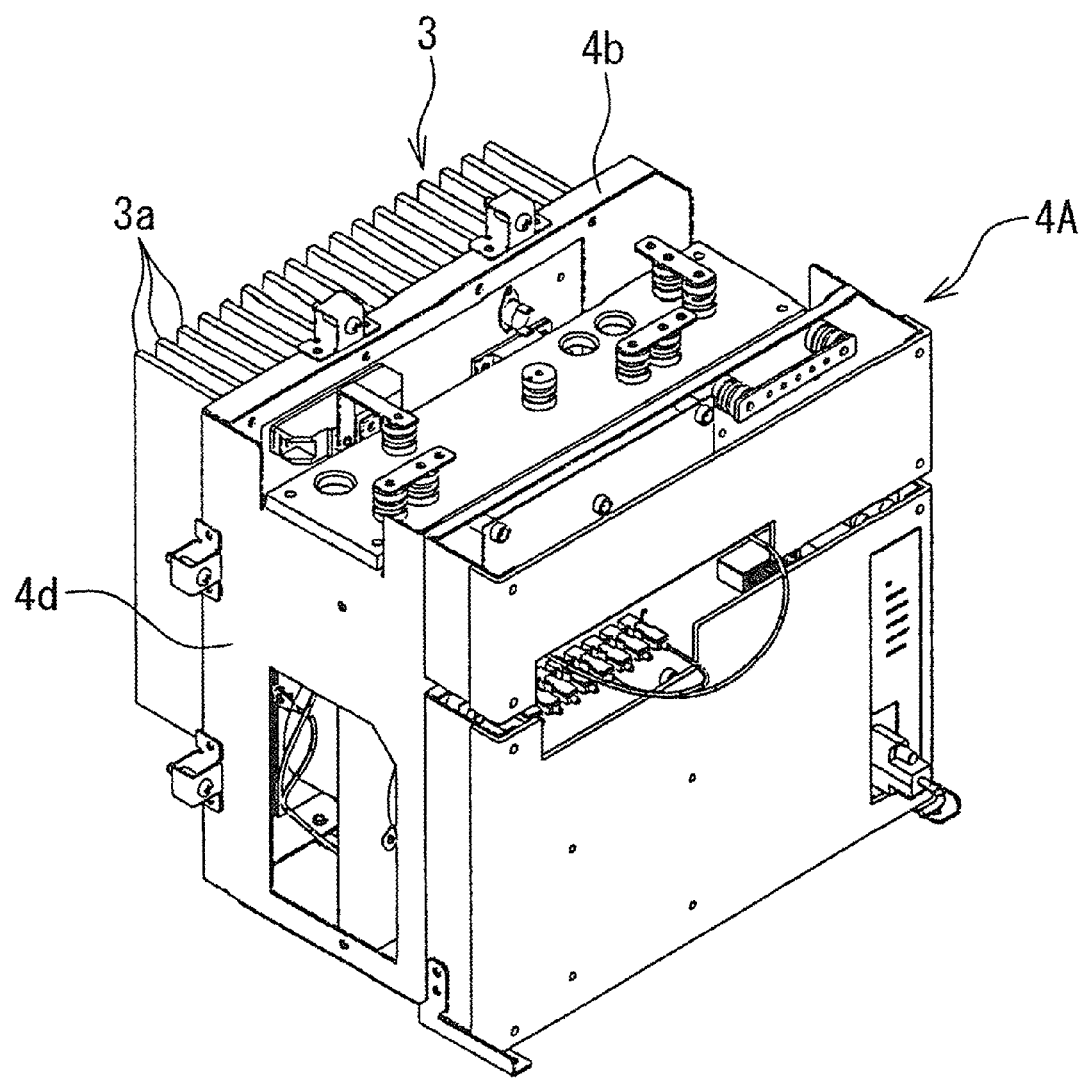
FIG. 5 is a perspective view showing an internal unit viewed from the front side thereof.
Figure 6:
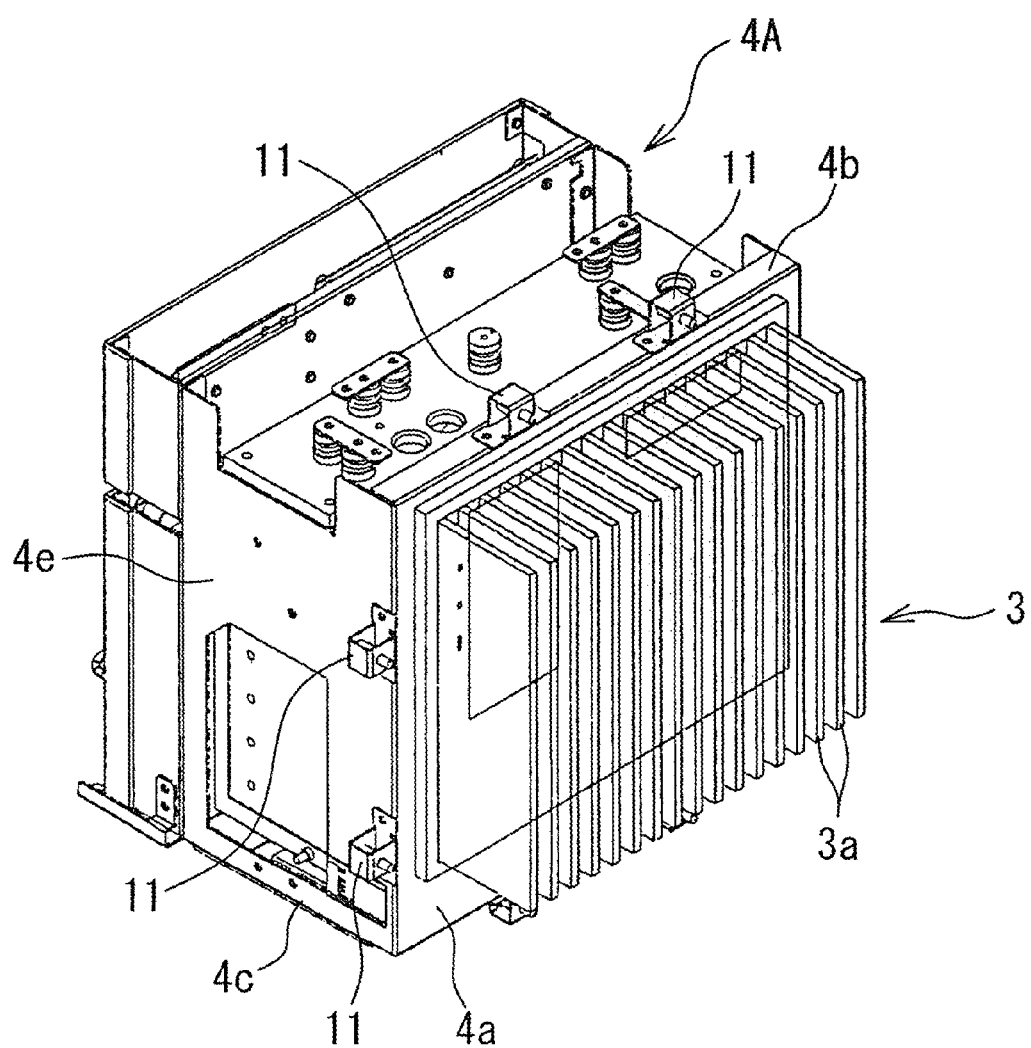
FIG. 6 is a perspective view showing the internal unit viewed from the rear side thereof.
Figure 7:
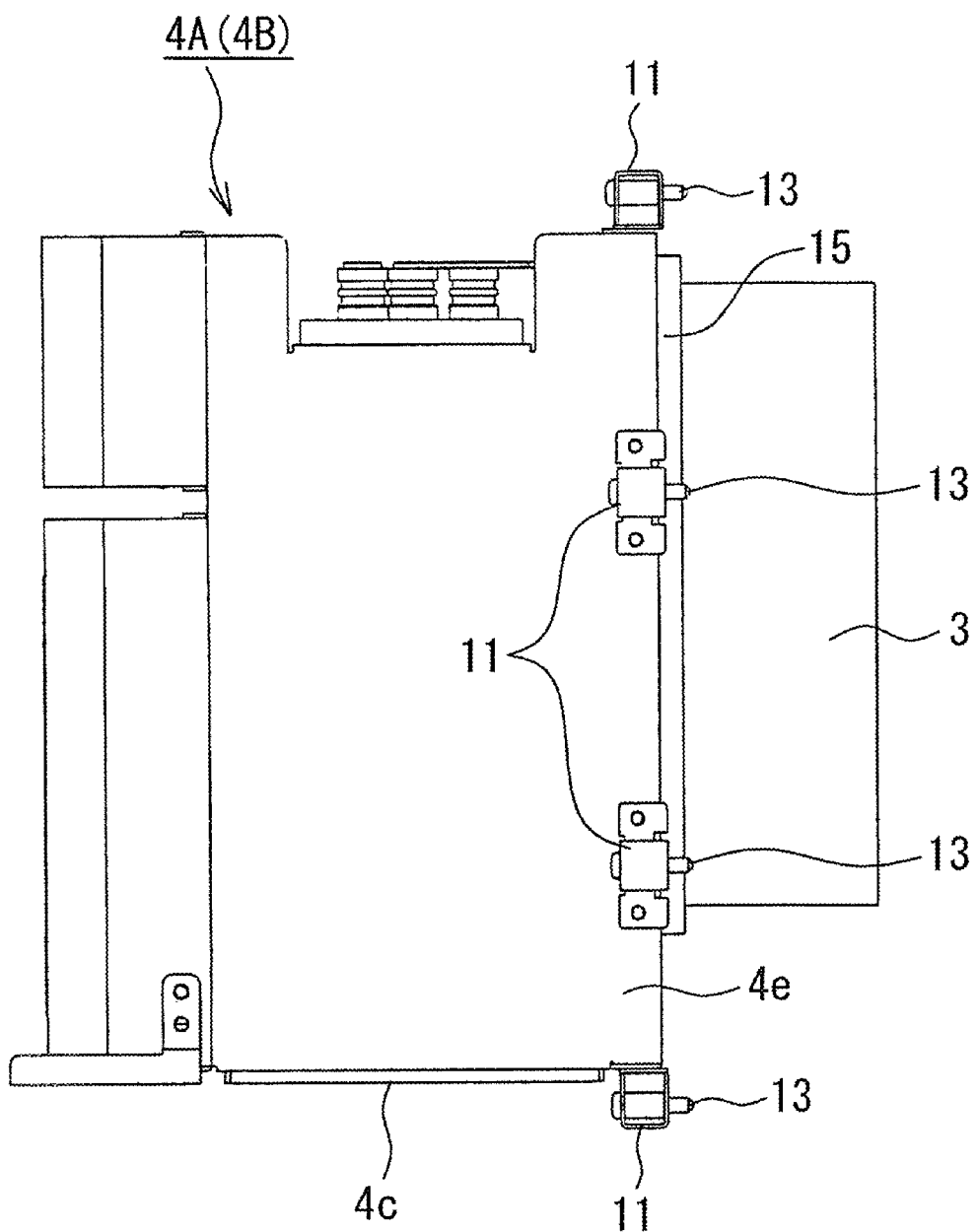
FIG. 7 is a right side view showing the internal unit.
Figure 8:
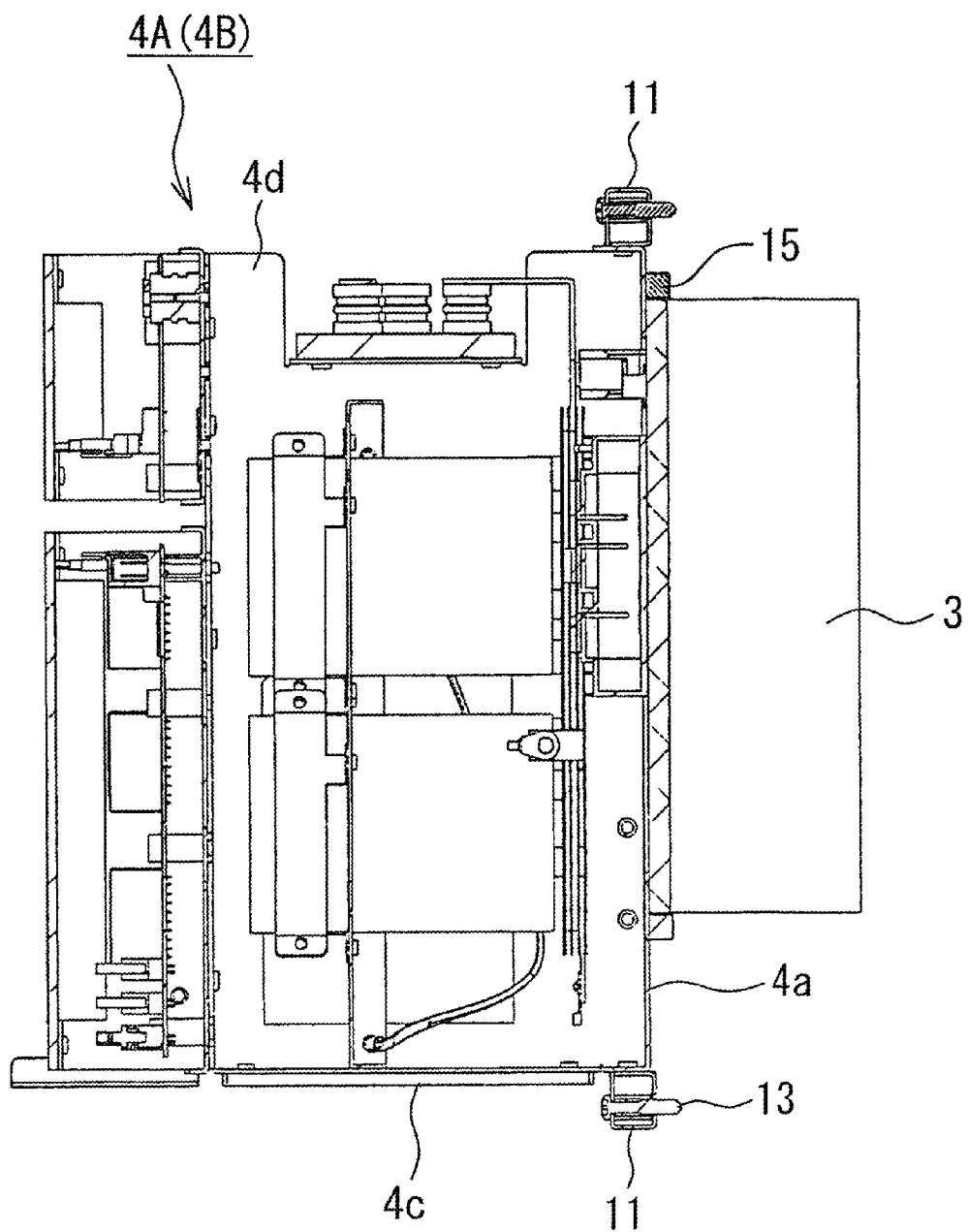
FIG. 8 is a cross sectional view showing a capacitor mounting section of the internal unit.

FIG. 1 is an external perspective view showing an electric power converter for rolling stock according to the invention, FIG. 2 is a perspective view showing the electric power converter for rolling stock shown in FIG. 1 with a top plate thereof being removed, FIG. 3 is a perspective view showing the electric power converter for rolling stock shown in FIG. 2 viewed from the upper left on the opposite side in FIG. 2, and FIG. 4 is a perspective view showing the electric power converter for rolling stock shown in FIG. 1 with a left side plate thereof being removed.

In FIG. 1, reference numeral 1 denotes an electric power converter for rolling stock, which is formed to meet the outdoor specifications for an electric power converter mounted beneath the floor of rolling stock. The electric power converter for rolling stock 1 has an electric power converter case 2 mounted beneath the floor of rolling stock. The electric power converter case 2 is formed in rectangular-prism-like with a front plate 2a, a rear plate 2b, a left side plate 2c, a right side plate 2d, a top plate 2e and a bottom plate 2f.

As shown in FIGS. 2 and 3, the electric power converter case 2 has therein internal unit containing sections 5A and 5B, an outside air introduction section 6 on the rear side of the internal unit containing sections 5A and 5B, and internal unit containing sections 8A and 8B. In the internal unit containing sections 5A and 5B, internal units 4A and 4B each provided with a cooler 3 formed with cooling fins, for example, are contained, respectively, and in the internal unit containing sections 8A and 8B, internal units 7A and 7B each provided with no cooler are contained, respectively.

The outside air introduction section 6 communicates with the outside air by means of openings 6a and 6b formed in the top plate 2e shown in FIGS. 1 and 4. The outside air supplied from the opening 6a (or 6b) when the rolling stock is running is discharged from the opening 6b (or 6a).

As shown in FIGS. 2 and 3, the internal unit containing sections 5A and 5B are shielded in watertight from the outside air introduction section 6 by a unit mounting section 9 formed with a partition plate, for example. The unit mounting section 9 has cooler insertion openings 9a each formed therein through which the cooler 3 formed in each of the internal units 4A and 4B is inserted as further shown in FIG. 11 to FIG. 13.

Moreover, the unit mounting section 9 has screw insertion openings 9b. The screw insertion openings 9b are formed at positions facing securing holders 11 which are provided on the internal units 4A and 4B and will be explained later. On the side of the outside air introduction section 6 of each of the screw insertion openings 9b, a cap nut 9d closing the screw insertion openings 9b is fixed while keeping watertightness. The cap nut 9d has an internal thread portion 9c to which a necked screw 13 as a mounting screw is screwed in for securing the securing holder 11.

Each of the internal units 4A and 4B has a square rear plate 4a covering the rear side thereof. The rear plate 4a has the top end section thereof bent forward to form a flange section 4b, has the bottom end section thereof integrally formed with a bottom plate 4c extending forward, and has the left and right end sections thereof integrally formed with a left side and right side plates 4d and 4e, respectively, both of which extend forward. In addition, in a section a little upper on the rear side of the rear plate 4a, the cooler 3 is integrally formed which has a structure in which a number of cooling fins 3a, arranged in parallel at specified intervals in the lateral direction in an area smaller than that of the rear plate 4a, are formed to project onto the rear side.

Figure 9:
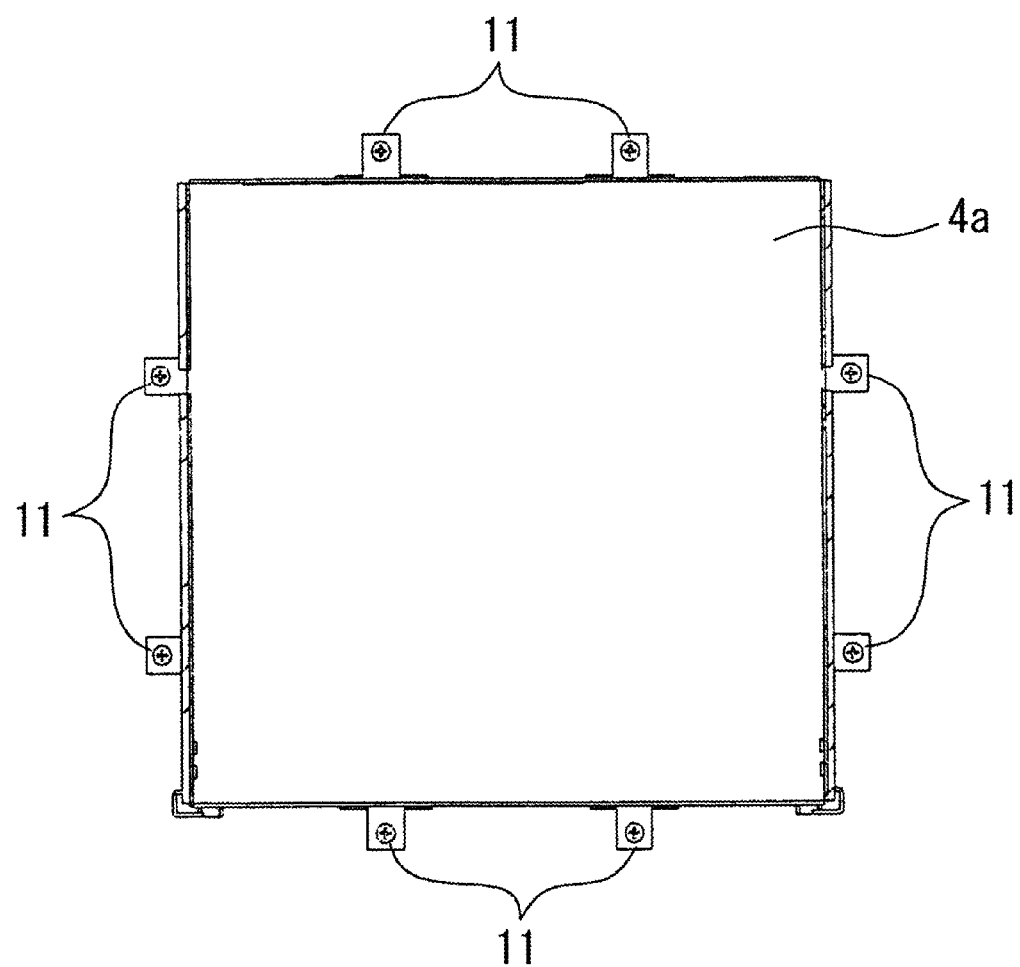
FIG. 9 is a rear view showing the internal unit.
Figure 10:
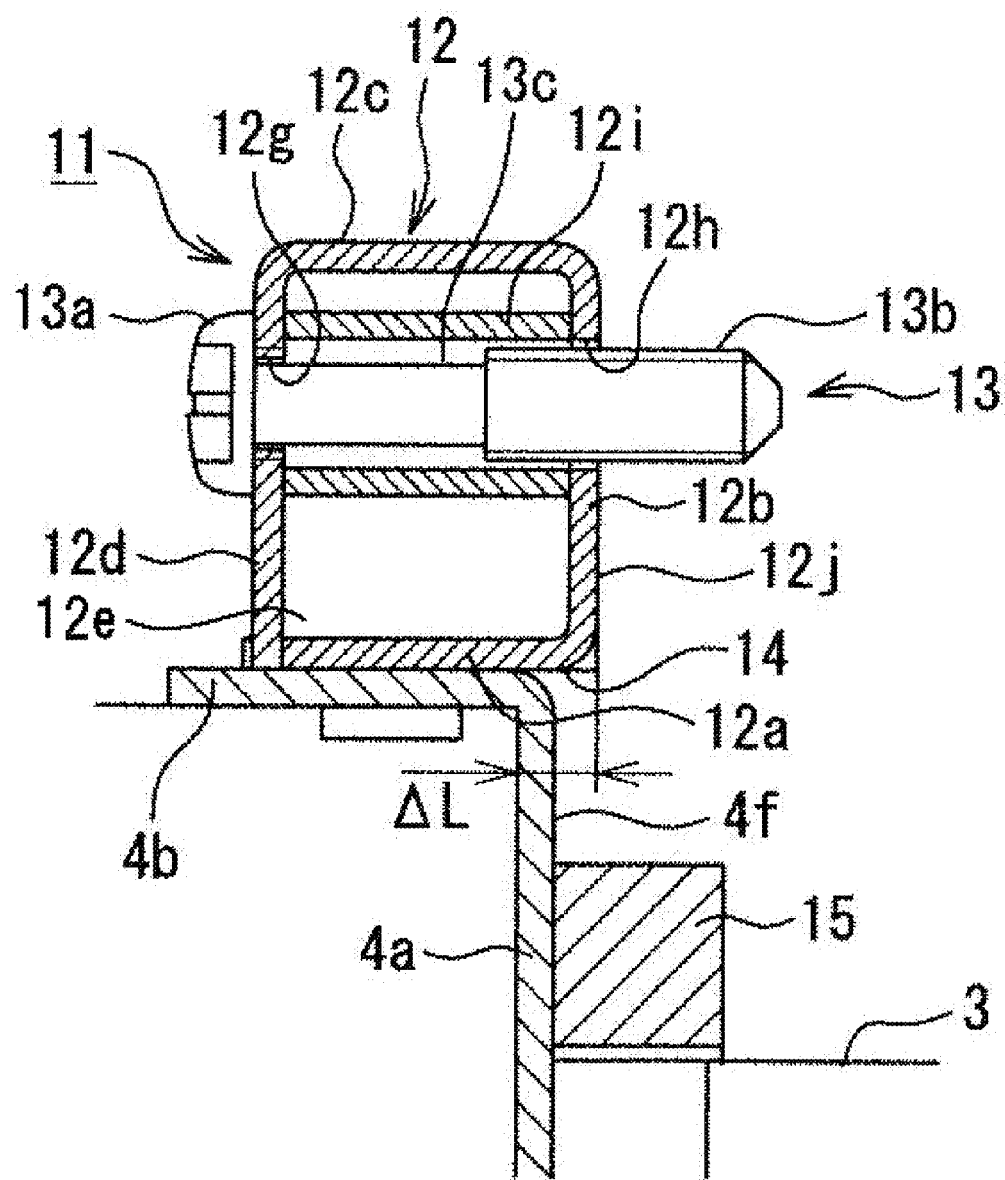
FIG. 10 is an enlarged side view showing a securing holder of the internal unit.

Moreover, as shown in FIG. 9, onto each of the flange section 4b, the bottom plate 4c, the left side plate 4d and the right side plate 4e respectively extending forward from the four sides of the rear plate 4a, two securing holders 11 are attached. Of the securing holders 11, a securing holder 11 attached onto the flange section 4b of the upper side of the rear plate 4a is shown in FIG. 10. As shown in FIG. 10, the securing holder 11 has a square tube 12 having the axis thereof taken in the direction along the upper side of the rear side plate 4a and having both ends thereof closed. Into the square tube 12, the necked screw 13 is rotatably attached.

The square tube 12 is provided with a bottom plate section 12a, a rear plate section 12b which is bent upward from the rear end of the bottom plate section 12a, a top plate section 12c which is bent forward from the top end of the rear plate section 12b, a front plate section 12d which is bent downward from the front end of the top plate section 12c, and a left side plate section 12e and a right side plate section not shown which close the left side and the right side ends, respectively, in the direction of the axis of the square tube 12. Moreover, as shown in FIG. 10, the front end of the bottom plate section 12a to be a beginning and the bottom end of the front plate section 12d to be a terminal are securely connected together to integrally form the square tube 12.

The front plate section 12d of the square tube 12 has an internal thread portion 12g formed therein. The rear plate section 12b facing the internal thread portion 12g has a through hole 12h formed therein. Between the front plate section 12d and the rear plate section 12b, a cylindrical hollow spacer 12i is secured so as to connect the internal thread portion 12g and the through hole 12h. The square tube 12, after the hollow spacer 12i is attached to the inside thereof by securing means such as soldering, bonding, fitting and junction, has the front end of the bottom plate section 12a to be the beginning and the bottom end of the front plate section 12d to be the terminal securely connected together by securing means such as soldering, bonding, fitting and junction.

To the square tube 12, the necked screw 13 is rotatably attached while long in the direction from the front to the rear. The necked screw 13 has a neck 13c with a smaller diameter formed between a head 13a and a front external thread portion 13b. For attaching the necked screw 13 to the square tube 12, the front external thread portion 13b of the necked screw 13 is first made to be brought into thread engagement with the internal thread portion 12g formed in the front plate section 12d to be made to project from the through hole 12h while being guided by the hollow spacer 12i. Then, the front external thread portion 13b, on getting out from the thread engagement with the internal thread portion 12g, brings the neck 13c of the necked screw 13 to face the internal thread portion 12g. Thus, by letting the necked screw 13 be pushed into the internal thread portion 12g, the necked screw 13 can be rotatably held with the head 13a made to butt against the front plate section 12d.

Each of the securing holders 11 is secured to each of the flange section 4b of the rear plate 4a, the bottom plate 4c, the left side plate 4d and the right side plate 4e with its position determined so that a butting surface 12j, butting against the unit mounting section 9 on the rear side of the rear plate section 12b of the securing holders 11, protrudes backward from the opposed surface 4f of the rear plate 4a facing the unit mounting section 9 to form a step 14 with a specified protrusion length ΔL in each of the internal units 4A and 4B.

Moreover, at the position where the cooling fins 3a are attached to the rear plate 4a, a square frame-like sealing gasket 15 is arranged so as to surround the periphery of the cooling fins 3a. The sealing gasket 15 has a thickness larger than the specified protrusion length ΔL of the step 14.

In the next, a way of mounting the internal units 4A and 4B of the embodiment on the unit mounting section 9 will be explained.

First, as shown in FIG. 10, around the mounting position of the cooler 3 on the rear plate 4a of the internal unit 4A (or 4B), the sealing gasket 15 having the thickness larger than the specified protrusion length ΔL of the step 14 is attached with the surface on the rear plate 4a side made to be in contact with the rear plate 4a.

Figure 12:
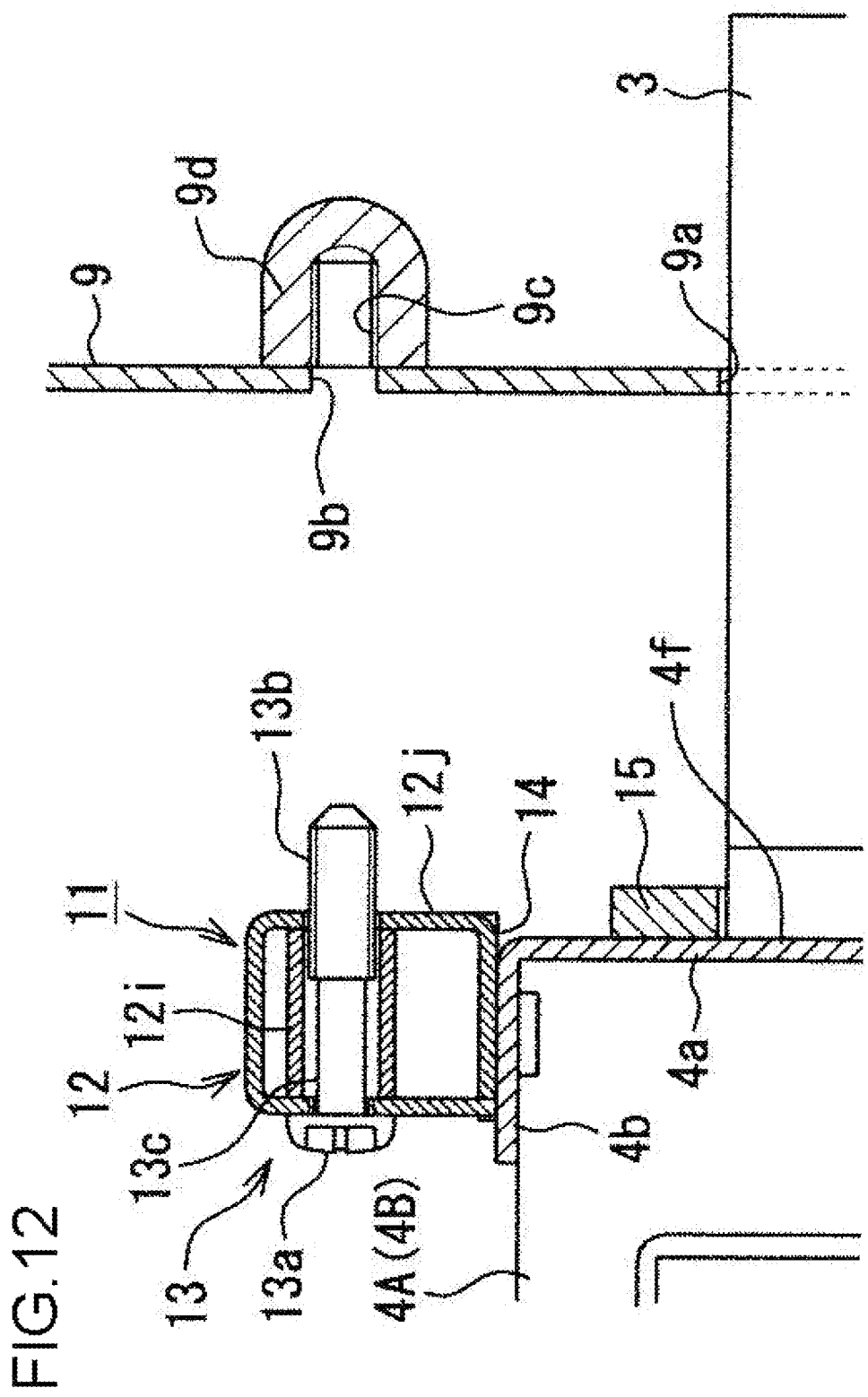
FIG. 12 is an enlarged cross sectional view showing a state in which the cooler of the internal unit has been inserted into the cooler insertion opening of the unit mounting section.

Next to this, as shown in FIG. 11, the cooler 3 of the internal unit 4A (or 4B) is made to face the cooler insertion opening 9a of the unit mounting section 9. In this state, by moving the cooler 3 of the internal unit 4A (or 4B) onto the unit mounting section 9 side and, as shown in FIG. 12, the cooler 3 is made to be inserted into the cooler insertion opening 9a of the unit mounting section 9.

Figure 13:
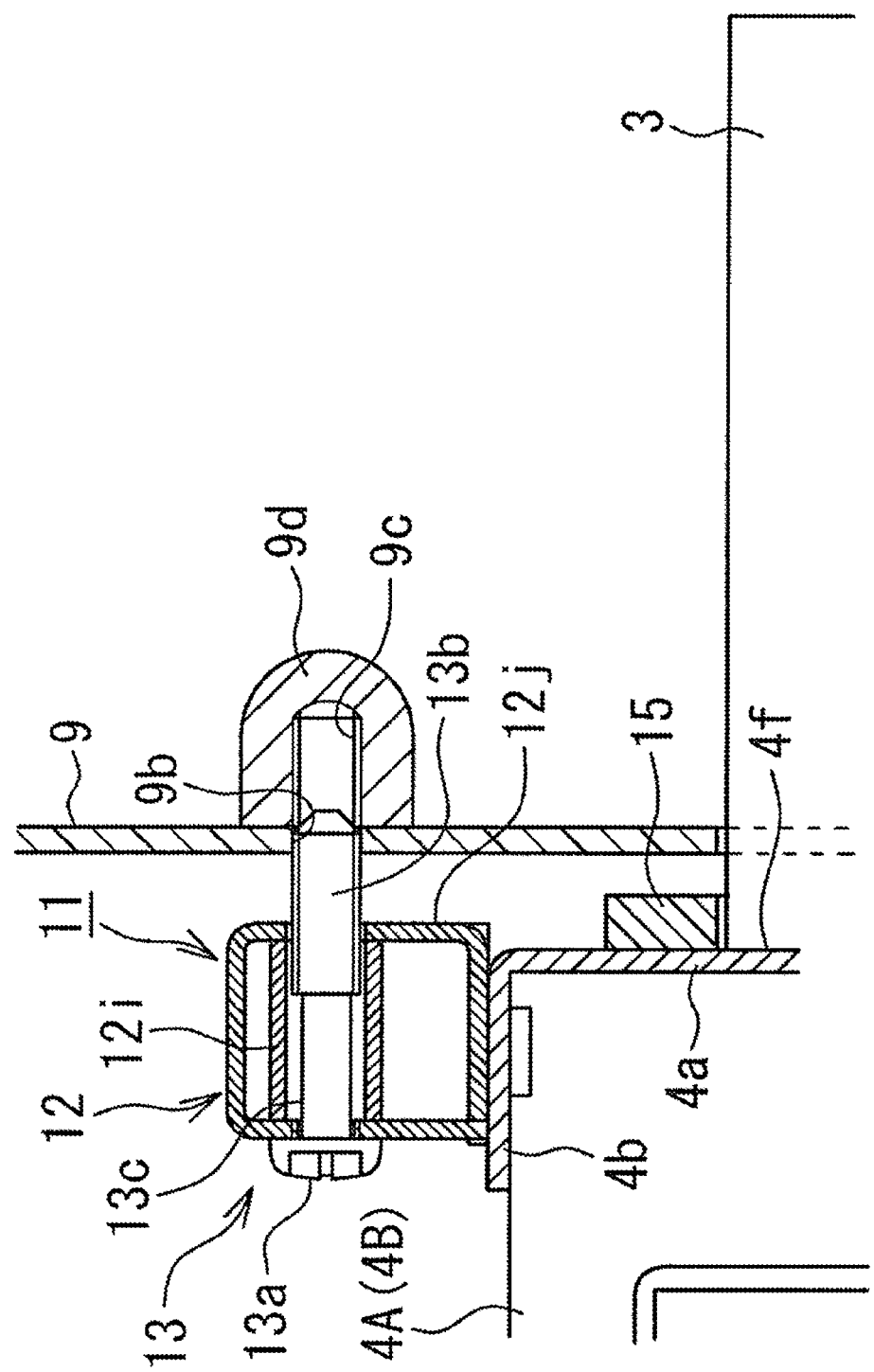
FIG. 13 is an enlarged cross sectional view showing a state in which a necked screw in the securing holder of the internal unit is brought into thread engagement with a cap nut of the unit mounting section.

Thereafter, by further making the internal unit 4A (or 4B) shift toward the unit mounting section 9 side, the front external thread portion 13b of the necked screw 13 attached to the securing holders 11 is inserted into the screw insertion opening 9b in the unit mounting section 9. In this state, by carrying out rotational driving of the head 3a of the necked screw 13 with a tightening tool such as an electric powered screw driver, the front external thread portion 13b is brought into thread engagement with the internal thread portion 9c of the cap nut 9d. In this state, however, as shown in FIG. 13, the surface of the sealing gasket 15 on the side of the unit mounting section 9 is still apart forward from the unit mounting section 9, in which the sealing gasket 15 is out of a compressed state.

Figure 14:
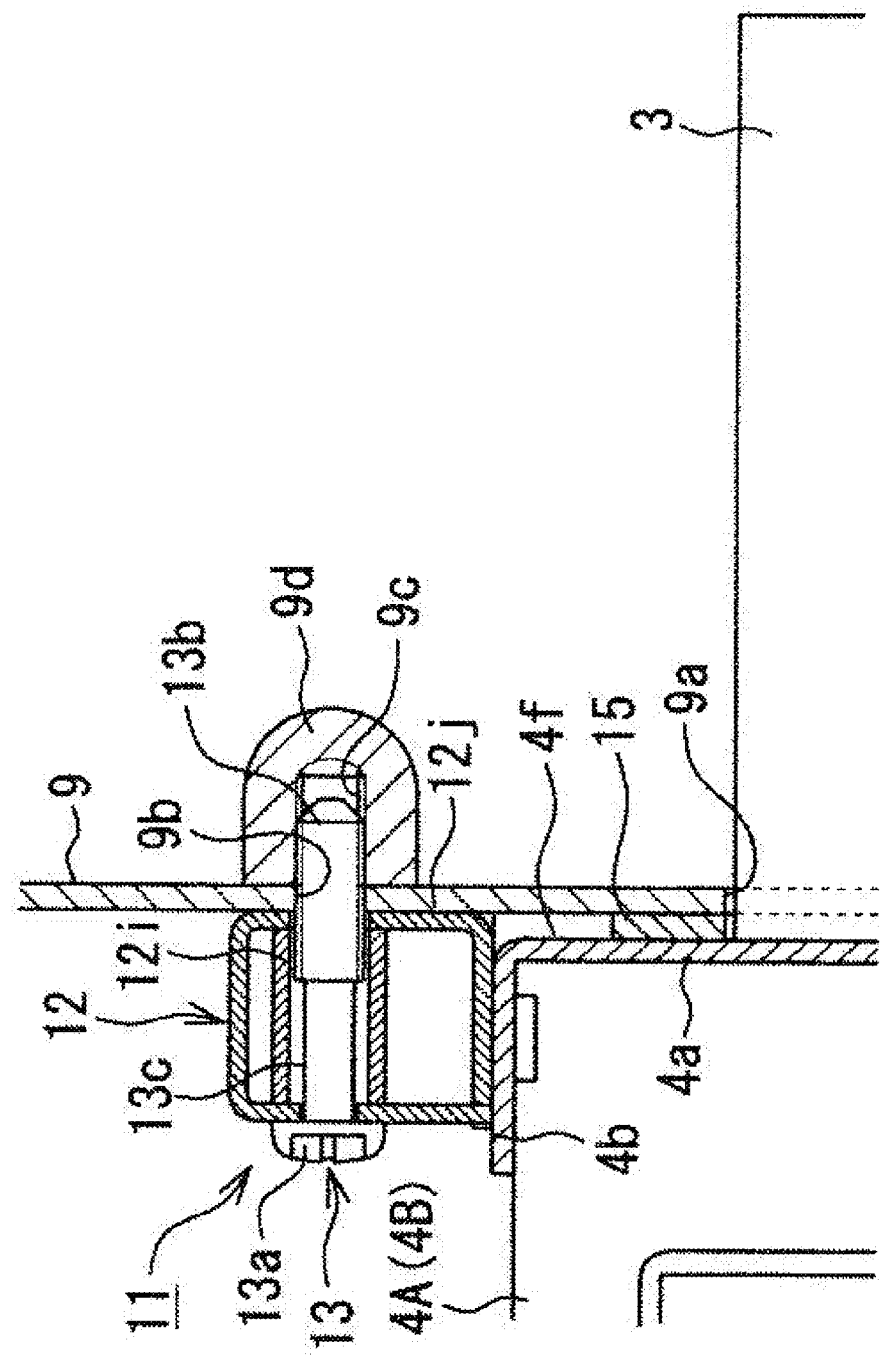
FIG. 14 is an enlarged side view showing a state in which the internal unit is attached to the unit mounting section.

Then, by further rotating the necked screw 13, the front external thread portion 13b thereof is brought into the further inner part of the internal thread portion 9c of the cap nut 9d while being in thread engagement therewith. Thus, when the spacing between the unit mounting section 9 and the opposed surface 4f of the rear plate 4a of the internal unit 4A (or 4B) becomes less than the thickness of the sealing gasket 15, the sealing gasket 15 is brought into a compressed state. Thereafter, as shown in FIG. 14, the butting surface 12j of the securing holder 11 butts against the surface of the unit mounting section 9, by which the further shift of the internal unit 4A (or 4B) toward the unit mounting section 9 side is restricted. This makes the thickness of the sealing gasket 15 in the compressed state equal to the protrusion length ΔL between the butting surface 12j of the securing holders 11 and the opposed surface 4f of the rear plate 4a of the internal unit 4A (or 4B) to bring the sealing gasket 15 into a properly compressed state.

In this way, according to the embodiment, the thickness of the sealing gasket 15 becomes equal to the protrusion length ΔL at the step 14 between the butting surface 12j of the securing holders 11 and the opposed surface 4f of the rear plate 4a facing the unit mounting section 9 in the internal unit 4A (or 4B). Thus, by setting the protrusion length ΔL of the step 14 so as to be the proper compressed thickness of the sealing gasket 15, the sealing gasket 15 can be exactly compressed to constantly have the proper compressed thickness only by making the butting surface 12j of the securing holders 11 butt against the unit mounting section 9 with the necked screw 13 made tightened without relying on the tightening torque applied to the necked screw 13. This permits reliable sealing around the cooler insertion openings 9a with the sealing gaskets 15 with the coolers 3 of the internal units 4A and 4B being inserted through their respective cooler insertion openings 9a formed in the unit mounting section 9 to be made to protrude into the outside air introduction section 6, by which reliable drip-proof ability can be ensured.

In addition, the hollow spacer 12i provided for making the internal thread portion 12g and the through hole 12h of the securing holder 11 communicate with each other allows the necked screw 13 to be guided to the through hole 12h without being dropped into the securing holder 11 when the necked screw 13 is attached to the securing holder 11. Along with this, the necked screw 13 is reliably prevented from missing after having been attached to the securing holder 11. Furthermore, since the hollow spacer 12i bridges the inside faces of the rear plate section 12b and the front plate section 12d, the tightening load applied when tightening the necked screw 13 can be received by the hollow spacer 12i even in the case when the securing holder 11 is formed to be hollow for weight reduction. Thus, the mechanical strength of the securing holder 11 can be ensured.

Moreover, the unit mounting section 9 has screw insertion openings 9b formed through each of which the front external thread portion 13b of the necked screw 13 is inserted. The outside air introduction section 6 side of the screw insertion opening 9b is sealed with the cap nut 9d. Thus, the drip-proof ability at the position of each of the screw insertion openings 9b can be ensured without using additional sealing material such as a gasket.

Furthermore, the cooling fins 3a forming the cooler 3 mounted on the rear side of each of the internal units 4A and 4B are directly exposed to the outside air introduced into the outside air introduction section 6. Therefore, without providing additional heat pipes, the cooling effect of each of the internal units 4A and 4B can be enhanced with a simple structure.

In certain embodiments, the case in which the securing holder 11 is formed with a square tube 12 both ends of which are closed. Embodiments of the invention, however, are not limited to such a configuration. Namely, as long as a step 14 with the protrusion length ΔL, being equal to the proper compressed thickness of the sealing gasket 15, can be formed between the butting surface 12j butting against the unit mounting section 9 and the opposed surface 4f facing the unit mounting section 9 in the internal units 4A and 4B, the securing holder 11 itself can be made to have any arbitrary shape. Alternatively, other step dimensions can be used as well.

Figure 15:
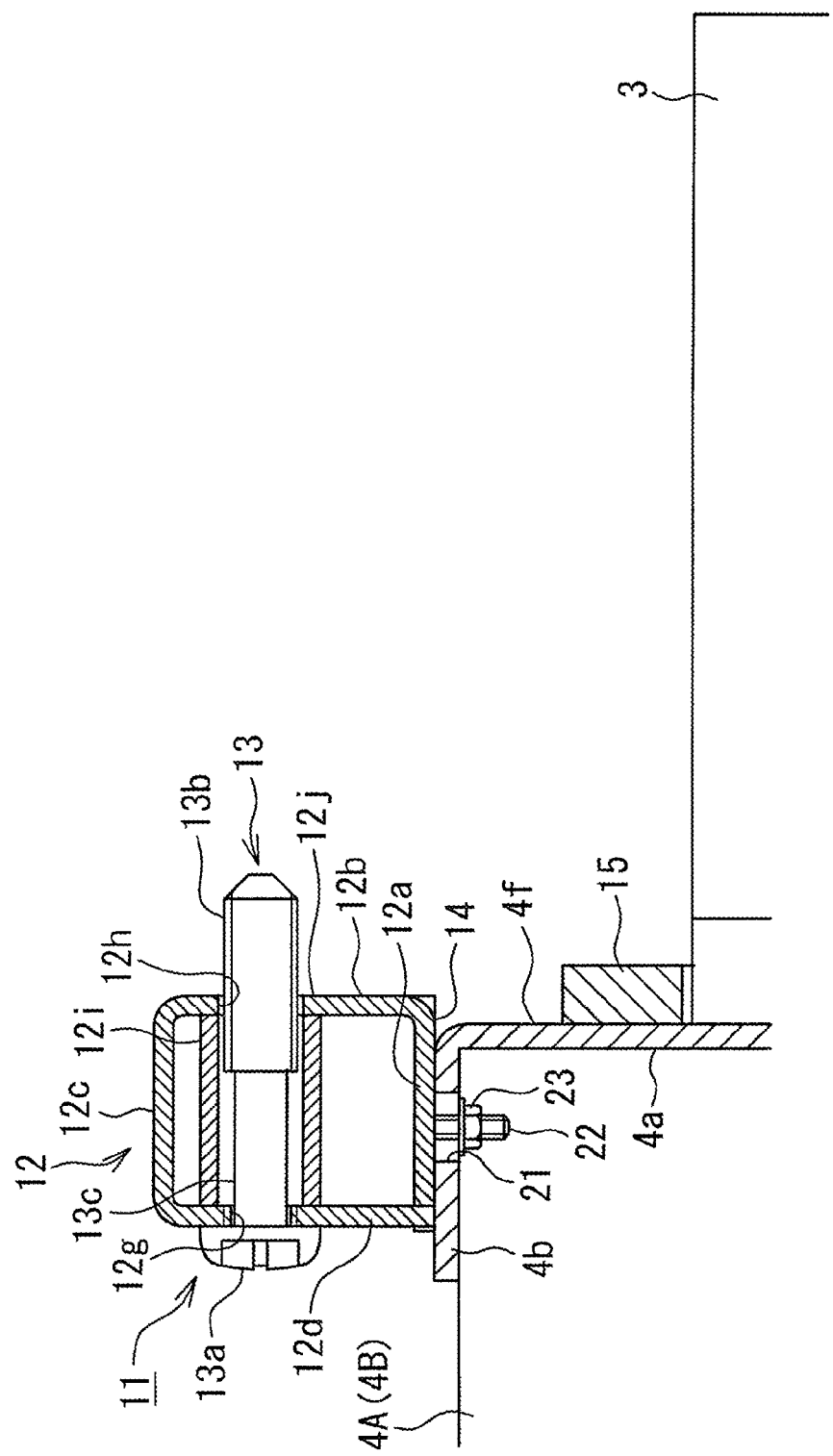
FIG. 15 is an enlarged cross sectional view showing an example of modification of the securing holder applicable to the invention.

Moreover, in certain embodiments, the case in which the securing holders 11 are secured to the internal units 4A and 4B beforehand. Embodiments of the invention, however, are not limited to this. Namely, the securing holders 11 can be secured as shown in FIG. 15. In this case, each of the internal units 4A and 4B is made to have a long opening 21 formed which extends in the forward and backward directions at a position on a section where the securing holder 11 is to be attached (at a position on the flange section 4b of the rear plate 4a, for example). Into the long opening 21, a screw 22 is inserted which is secured to the bottom plate section 12a of the securing holder 11 so as to project downward. After the position of the securing holder 11 is adjusted backward and forward according to the proper compressed thickness of the sealing gasket 15, a nut 23 is made to be in thread engagement with the screw 22 to be tightened inside each of the internal units 4A and 4B to make the securing holder 11 is secured thereto.

While embodiments of the present invention have been particularly shown and described, it will be understood by those skilled in the art that the foregoing and other changes in form and details can be made therein without departing from the spirit and scope of embodiments of the present invention.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2011-154525, filed on Jul. 13, 2011. The disclosure of the priority application, in its entirety, including the drawings, claims, and the specification thereof, is incorporated herein by reference.

What is claimed is:

1. An electric power converter for rolling stock comprising:
    an electric power converter case mounted on rolling stock;
    a unit mounting section formed in the electric power converter case, the unit mounting section having an insertion opening; and
    an internal unit mounted on the unit mounting section, the internal unit comprising:
        a cooler projecting from the unit mounting section through the insertion opening; and
        a plurality of securing holders being made to butt against the unit mounting section for securing the internal unit,
    each of the securing holders having a butting surface for butting against the unit mounting section and forming a step by making the butting surface protrude from the surface of the internal unit facing the unit mounting section, and
    a sealing gasket having a thickness larger than the protrusion length of the step being arranged between the unit mounting section and the surface of the internal unit facing the unit mounting section.

2. The electric power converter for rolling stock as claimed in claim 1 wherein each of the securing holders has a mounting screw rotatably held therein, and the unit mounting section has insertion openings each for inserting the mounting screw and has cap nuts each closing the insertion openings on the side opposite to the securing holders and being made to be in thread engagement with the mounting screw.

3. The electric power converter for rolling stock as claimed in claim 2 wherein each securing holder at least comprises:
- a square tube arranged so that the direction of the axis thereof is in parallel with the unit mounting section, the square tube comprising:
  - a side plate section having an internal thread portion, the side plate section being arranged on the opposite side of the unit mounting section; and
  - a side plate section having a through hole, the side plate section being arranged on the side of the unit mounting section so as to make the through hole face the internal thread portion; and
- a hollow spacer arranged in the square tube so as to make the internal thread portion and the through hole communicate with each other,
- the mounting screw being attached to the square tube as a necked screw formed with a head, an external thread portion provided on the front side and a neck formed between the head and the external thread portion with a diameter smaller than that of the external thread portion so that the external thread portion is made to pass through the internal thread portion while being brought into thread engagement with the internal thread portion before the neck is inserted into the internal thread portion, and then the external thread portion protrudes onto the unit mounting section side through the through hole.

4. The electric power converter for rolling stock as claimed in claim 3 wherein the square tube is formed with a plate bent to form the side plate section having the internal thread portion, the side plate section having the through hole in parallel with the side plate section having the internal thread portion, a top plate section connecting the top end of the side plate section having the internal thread portion and the top end of the side plate section having the through hole, and a bottom plate section connecting the bottom end of the side plate section having the internal thread portion and the bottom end of the side plate section having the through hole, and with the beginning and the terminal of the bent plate connected together after the hollow spacer is secured inside the bent plate.

5. The electric power converter for rolling stock as claimed in claim 1, wherein the securing holders are arranged around the cooler and, between the cooler and the securing holders, the sealing gasket is arranged so as to surround the cooler.

6. The electric power converter for rolling stock as claimed in claim 1, wherein each of the securing holders is attached to the internal unit with the protrusion length of the step made adjustable to the compressed thickness of the sealing gasket.

7. The electric power converter for rolling stock as claimed in claim 1, wherein the surface of the internal unit opposite to the unit mounting section is formed in square on each side of which at least one of the securing holders is attached.

8. The electric power converter for rolling stock as claimed in claim 1, wherein the electric power converter case has therein an outside air introduction section having the outside air introduced thereto and an internal unit containing section containing the internal unit and shielded from the outside air introduction section by the unit mounting section, and is provided with a top plate having an opening that makes the outside air introduction section communicate with the outside.

9. The electric power converter for rolling stock as claimed in claim 2, wherein the electric power converter case has therein an outside air introduction section having the outside air introduced thereto and an internal unit containing section containing the internal unit and shielded from the outside air introduction section by the unit mounting section, and is provided with a top plate having an opening that makes the outside air introduction section communicate with the outside.

10. The electric power converter for rolling stock as claimed in claim 3, wherein the electric power converter case has therein an outside air introduction section having the outside air introduced thereto and an internal unit containing section containing the internal unit and shielded from the outside air introduction section by the unit mounting section, and is provided with a top plate having an opening that makes the outside air introduction section communicate with the outside.

11. The electric power converter for rolling stock as claimed in claim 4, wherein the electric power converter case has therein an outside air introduction section having the outside air introduced thereto and an internal unit containing section containing the internal unit and shielded from the outside air introduction section by the unit mounting section, and is provided with a top plate having an opening that makes the outside air introduction section communicate with the outside.

* * * * *